(12) United States Patent
Chiu et al.

(10) Patent No.: US 10,342,144 B1
(45) Date of Patent: Jul. 2, 2019

(54) POWER SUPPLY WITH A STAGGERED CONFIGURATION

(71) Applicant: ACBEL POLYTECH INC., New Taipei (TW)

(72) Inventors: Jui Yang Chiu, New Taipei (TW); Cheng-Yen Yeh, New Taipei (TW); Hsien-Te Chiu, New Taipei (TW)

(73) Assignee: ACBEL POLYTECH INC., New Taipei (TW)

( * ) Notice: Subject to any disclaimer, the term of this patent is extended or adjusted under 35 U.S.C. 154(b) by 0 days.

(21) Appl. No.: 15/880,340

(22) Filed: Jan. 25, 2018

(51) Int. Cl.
  *H05K 5/00*  (2006.01)
  *H02M 1/42*  (2007.01)
  *H05K 7/20*  (2006.01)
  *G06F 1/18*  (2006.01)

(52) U.S. Cl.
  CPC ............ *H05K 5/006* (2013.01); *G06F 1/183* (2013.01); *H02M 1/42* (2013.01); *H05K 7/20136* (2013.01)

(58) Field of Classification Search
  CPC .. H05K 5/006; H05K 7/20136; H05K 7/1432; H05K 7/1492; H05K 7/209; H05K 7/20927; G06F 1/183; H02M 1/42; H02M 7/003
  See application file for complete search history.

(56) References Cited

U.S. PATENT DOCUMENTS

| | | | | |
|---|---|---|---|---|
| 6,542,997 | B1* | 4/2003 | Rolls | G06F 1/263 713/300 |
| 2009/0154090 | A1* | 6/2009 | Su | H05K 7/20909 361/679.49 |
| 2010/0172087 | A1* | 7/2010 | Jeffery | G11B 33/02 361/679.33 |
| 2013/0265714 | A1* | 10/2013 | Tsao | G06F 1/181 361/679.53 |
| 2015/0117077 | A1* | 4/2015 | Huang | H05K 7/1492 363/144 |
| 2015/0208543 | A1* | 7/2015 | Chen | H05K 7/1489 361/679.39 |
| 2016/0105057 | A1* | 4/2016 | Shih | H02M 1/4258 307/65 |
| 2017/0170733 | A1* | 6/2017 | Ferencz | H02M 3/33569 |
| 2017/0250010 | A1* | 8/2017 | Jen | H05K 7/1432 |

* cited by examiner

*Primary Examiner* — Steven T Sawyer
*Assistant Examiner* — Sagar Shrestha
(74) *Attorney, Agent, or Firm* — Ming Chow; Sinorica, LLC (57) ABSTRACT

A power supply with a staggered configuration includes a housing having an accommodation space, a first power supply module, a second power supply module, and an electric fan which are disposed inside the accommodation space. The first power supply module includes a first frontend power conversion unit and a first backend power conversion unit which are disposed at separate airflow passages. When the power supply is in operation, the electric fan turns and drives the air to flow into the housing in such a way that one airflow passage is through the first frontend power conversion unit and another airflow passage is through the first backend power conversion unit. In this way, the heat dissipation efficiency is increased with two separated air flow passages respectively flowing through and cooling down the first frontend power conversion unit and the first backend power conversion unit.

10 Claims, 8 Drawing Sheets

POWER SUPPLY WITH A STAGGERED CONFIGURATION

BACKGROUND OF THE INVENTION

1. Field of the Invention

The present invention relates to a power supply, and in particular, to a power supply with a staggered configuration.

2. Description of the Prior Arts

In applications of a specific power supply system, for example, an Automatic Transfer Switch (ATS) system, more than two power supply modules are provided for stability and reliability of the system. During normal operation, only one power supply module is in operation; however, when a system demand occurs, the power output will be transferred to another power supply module which will then be switched on to supply the power. Since only one power supply module is in operation at any time, all the heat loss occurs only in the active power supply module. Hence the heat source will be concentrated in specific areas. When the heat source is concentrated in specific areas, the heat dissipation will be more difficult utilizing conventional airflows.

Figure 7:
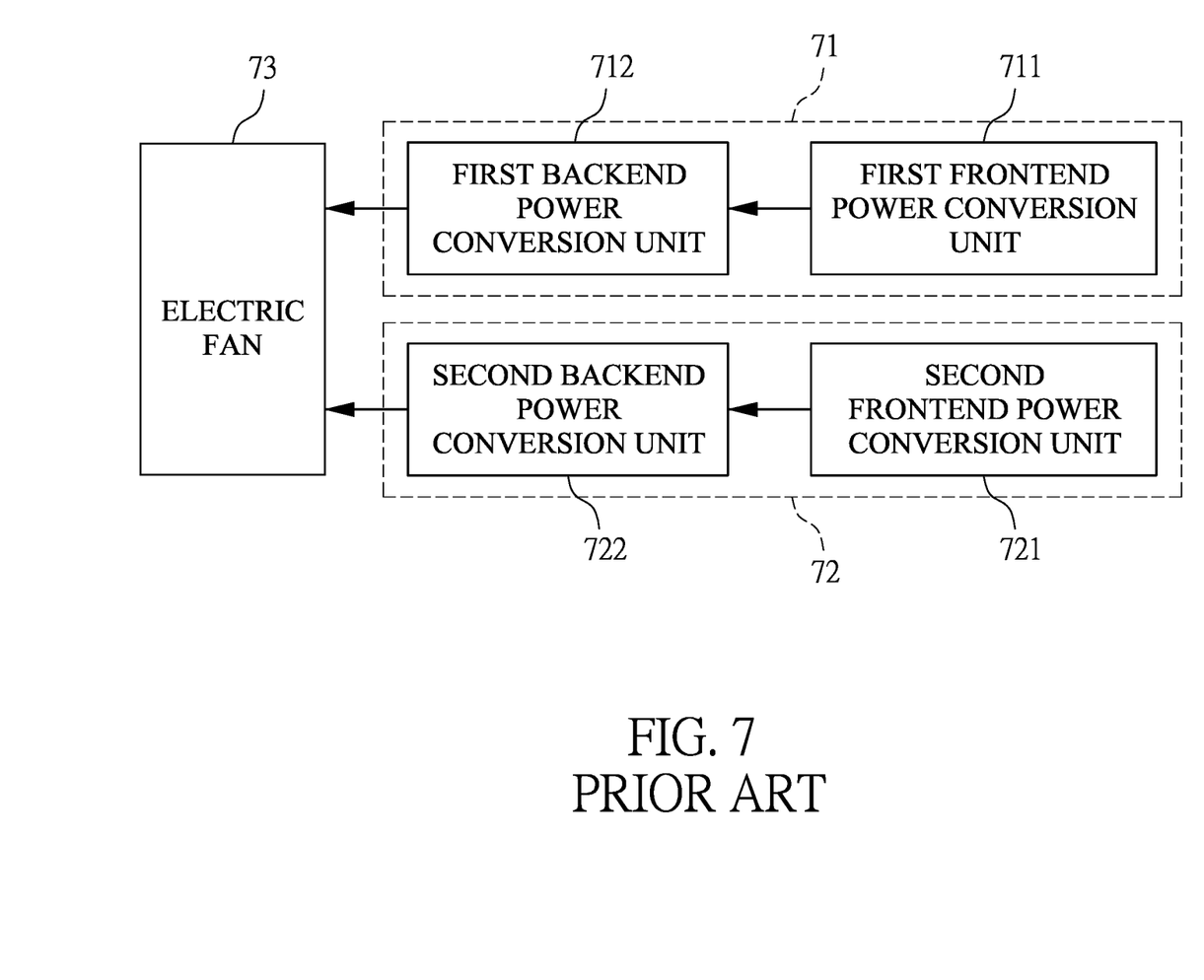
FIG. 7 is a block diagram of a conventional power supply.

Referring to FIG. 7 for a block diagram of a conventional ATS system, the conventional ATS system includes a first power supply module 71, a second power supply module 72, and an electric fan 73. The first power supply module 71 includes a first frontend power conversion unit 711 and a first backend power conversion unit 712. The second power supply module 72 also includes a second frontend power conversion unit 721 and a second backend power conversion unit 722. The first and the second frontend power conversion units 711 and 721 respectively include major components such as a power factor correction circuit (PFC) and a frontend processor. The first and the second backend power conversion units 712 and 722 respectively include major components such as a DC voltage to DC voltage conversion circuit (DC/DC converter) and a backend processor.

Figure 8:
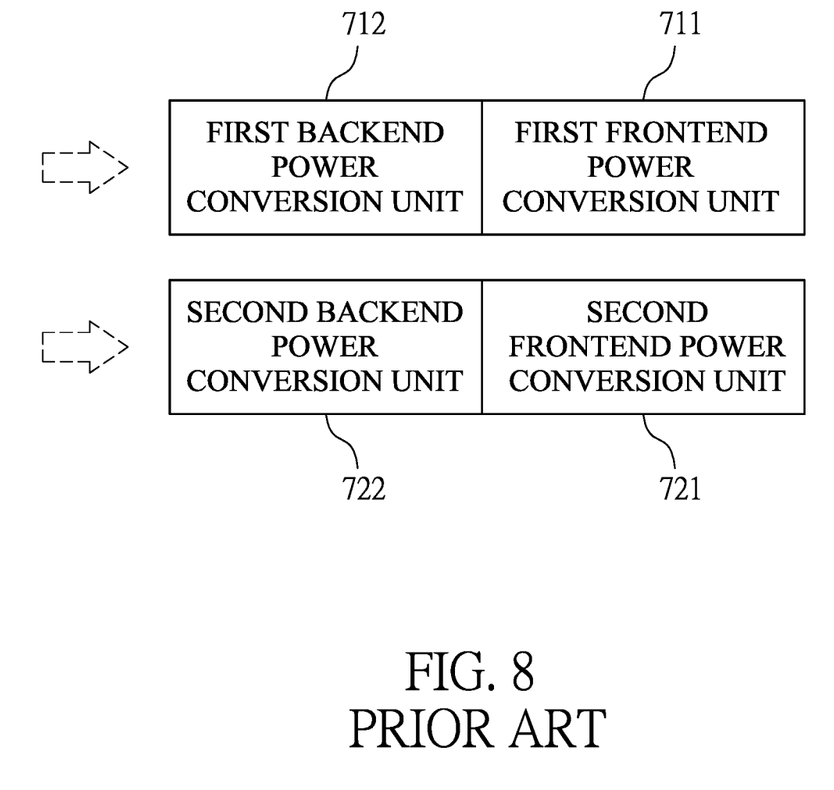
FIG. 8 is an airflow schematic of a conventional power supply.

As shown in FIG. 8, the ATS system is configured so that the first and the second power supply modules 71 and 72 are disposed in parallel along the lengthwise direction of the power supply modules. The first frontend power conversion unit 711 and the first backend power conversion unit 712 are disposed in tandem along the lengthwise direction of the power supply module 71. The second frontend power conversion unit 721 and the second backend power conversion unit 722 are disposed in tandem along the lengthwise direction of the power supply module 72. Conventionally, the electric fan 73 (not shown in FIG. 8) is disposed at the rear side of the first and the second backend power conversion units 712, 722, and the cooling airflow generated by the electric fan 73 flows from the backend to the frontend power conversion units as indicated by the arrows in FIG. 8.

The frontend power conversion units and the backend power conversion units have components tending to incur high temperature during operation, and as the airflow passes through and cools down the temperature of the heat generating components, the temperature of the airflow will be increased at the same time, and thus, the heat dissipation efficiency of the airflow will be decreased after its temperature rises. Taking the above ATS system as an example, if the first power supply module 71 is operating and the second power supply module 72 is idle, then all the heating components will be concentrated at the same side. Although the temperature of the air at the input vents for the power supply modules 71, 72 is the same, the airflow will get hotter and its cooling capability will be decreased significantly after passing through the first backend power conversion unit 712, and then the airflow won't be able to cool down the first frontend power conversion unit 711 as efficiently and that affects the overall heat dissipation efficiency.

SUMMARY OF THE INVENTION

In view of the shortcomings of the conventional ATS system due to poor power supply cooling efficiency, the present invention provides a power supply with a staggered configuration, comprising:

a housing including a first sidewall and a second sidewall which are in parallel with a first direction, wherein an accommodation space is formed between the first sidewall and the second sidewall, wherein, opposite ends of the housing along the first direction are a first end and a second end, respectively;

a first power supply module disposed inside of the accommodation space of the housing and between the first end and the second end of the housing;

a second power supply module disposed inside of the accommodation space of the housing and staggered with the first power supply module as well as between the first end and the second end of the housing; wherein the first power supply module includes a first frontend power conversion unit and a first backend power conversion unit; the second power supply module includes a second frontend power conversion unit and a second backend power conversion unit; wherein the first frontend power conversion unit and the second backend power conversion unit are next to the inner side of the first sidewall, and the second frontend power conversion unit and the first backend power conversion unit are next to the inner side of the second sidewall.

The first power supply module, the second power supply module, and the electric fan are disposed in tandem along the first direction. When the power supply with the staggered configuration is in operation, air enters and exits through the vents on the first end and the second end of the accommodation space of the housing. When the first power supply module is operating and the second power supply module is idling, the first frontend power conversion unit and the first backend power conversion unit are at separate air passages so that the two power conversion units are cooled down by the air flowing through separate air passages. By configuring the frontend power conversion units and the backend power conversion units of the two power supply modules in staggered positions, the heat dissipation efficiency can be effectively improved.

Other objectives, advantages and novel features of the invention will become more apparent from the following detailed description when taken in conjunction with the accompanying drawings.

DETAILED DESCRIPTION OF THE
PREFERRED EMBODIMENTS

The following, with the drawings and the preferred embodiments of the present invention, further illustrates the technical means that the present invention adopts to achieve the intended purpose.

Figure 1:
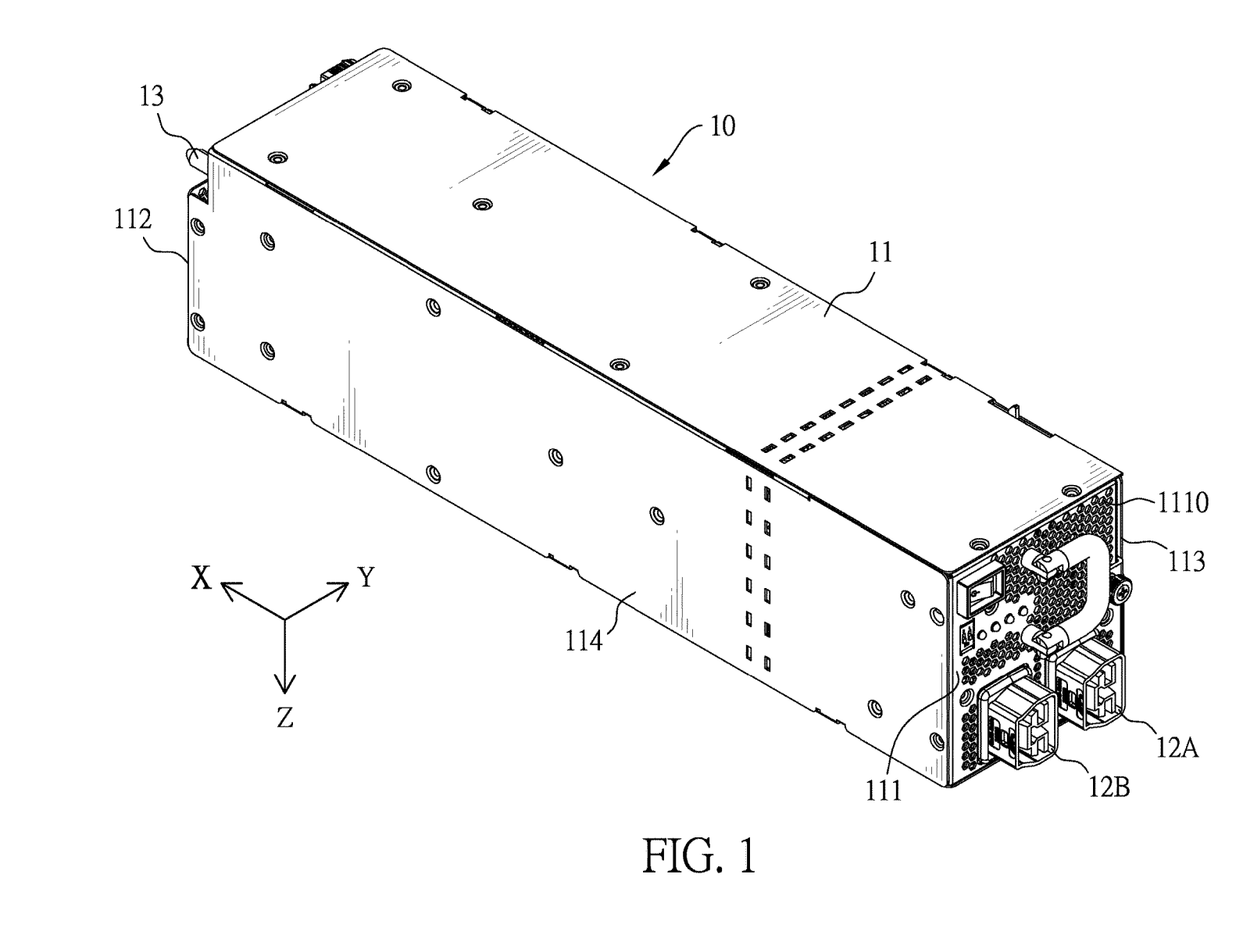
FIG. 1 is a perspective view of a preferred embodiment of the present invention.
Figure 2:
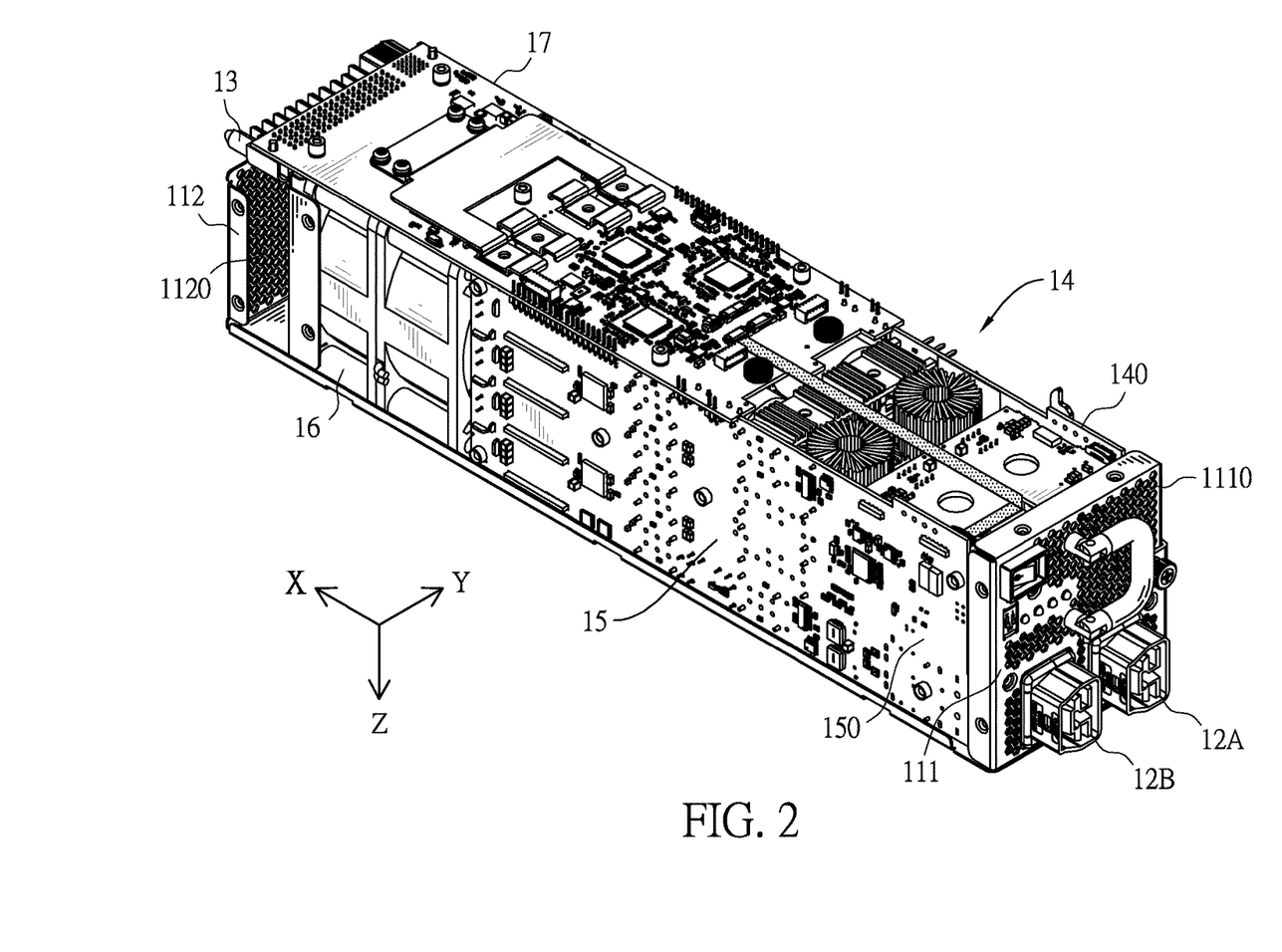
FIG. 2 is a perspective view of another preferred embodiment of the present invention.
Figure 3:
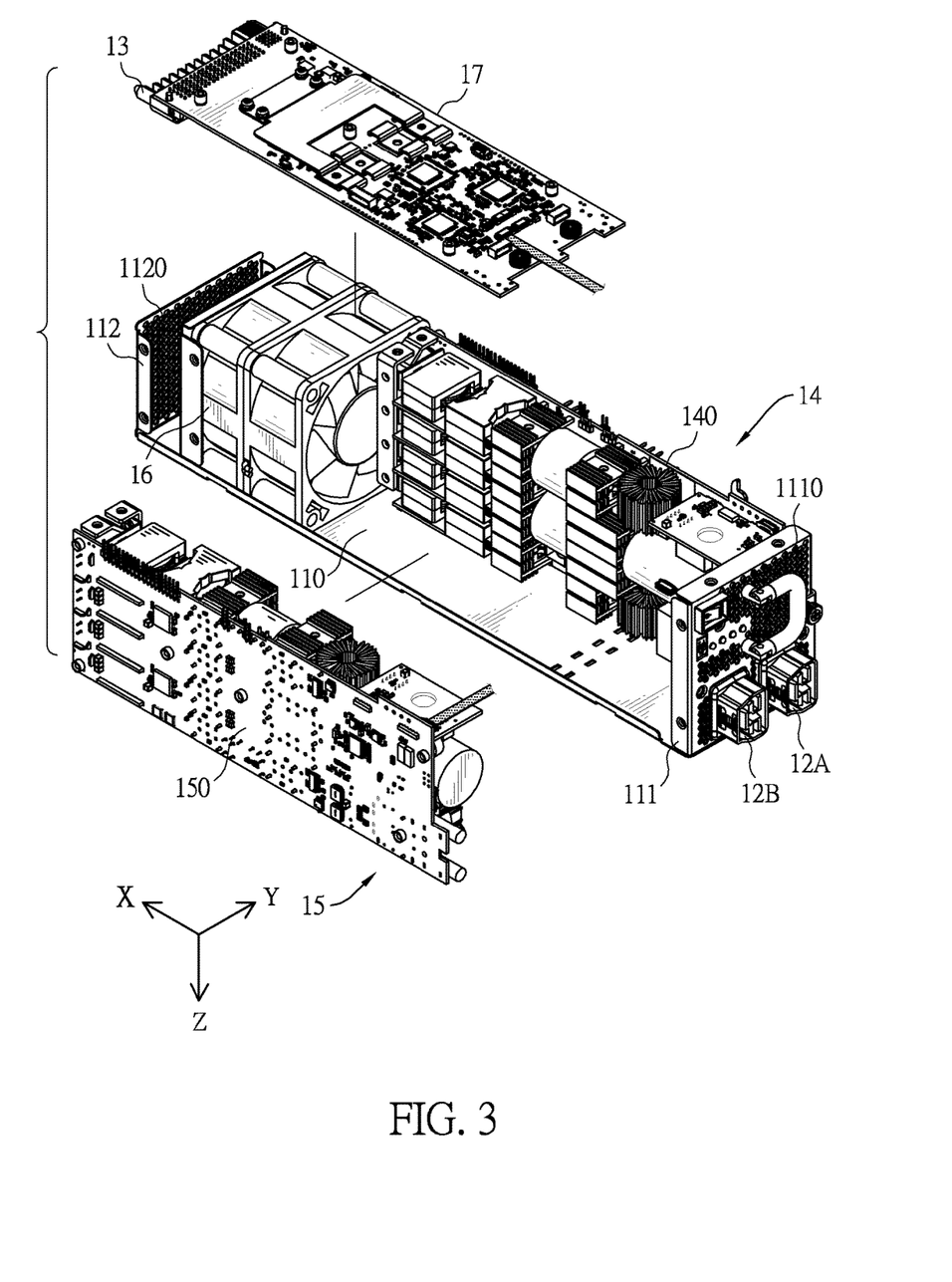
FIG. 3 is an exploded view of a preferred embodiment of the present invention.

Referring to FIG. 1, FIG. 2 and FIG. 3, the present invention is a power supply 10 with a staggered configuration for an automatic power transfer switch (ATS) system that includes a housing 11, a first power input port 12A, a second power input port 12B, a power output port 13, a first power supply module 14, a second power supply module 15, and an electric fan 16. The first power input port 12A and the second power input port 12B each may be an AC power input port or a DC power input port.

The housing 11 comprises a first sidewall 113 and a second sidewall 114 that are disposed in parallel with a first direction X. An accommodation space 110 is formed between the first sidewall 113 and the second sidewall 114. Two opposite ends of the housing 11 along the first direction X are a first end 111 and a second end 112, respectively.

The first and the second power input ports 12A, 12B are disposed on the first end 111 of the housing 11. The power output port 13 is disposed on the second end 112 of the housing 11. Multiple vents 1110, 1120 are disposed on the first end 111 and the second end 112 of the housing 11, respectively.

Figure 4:
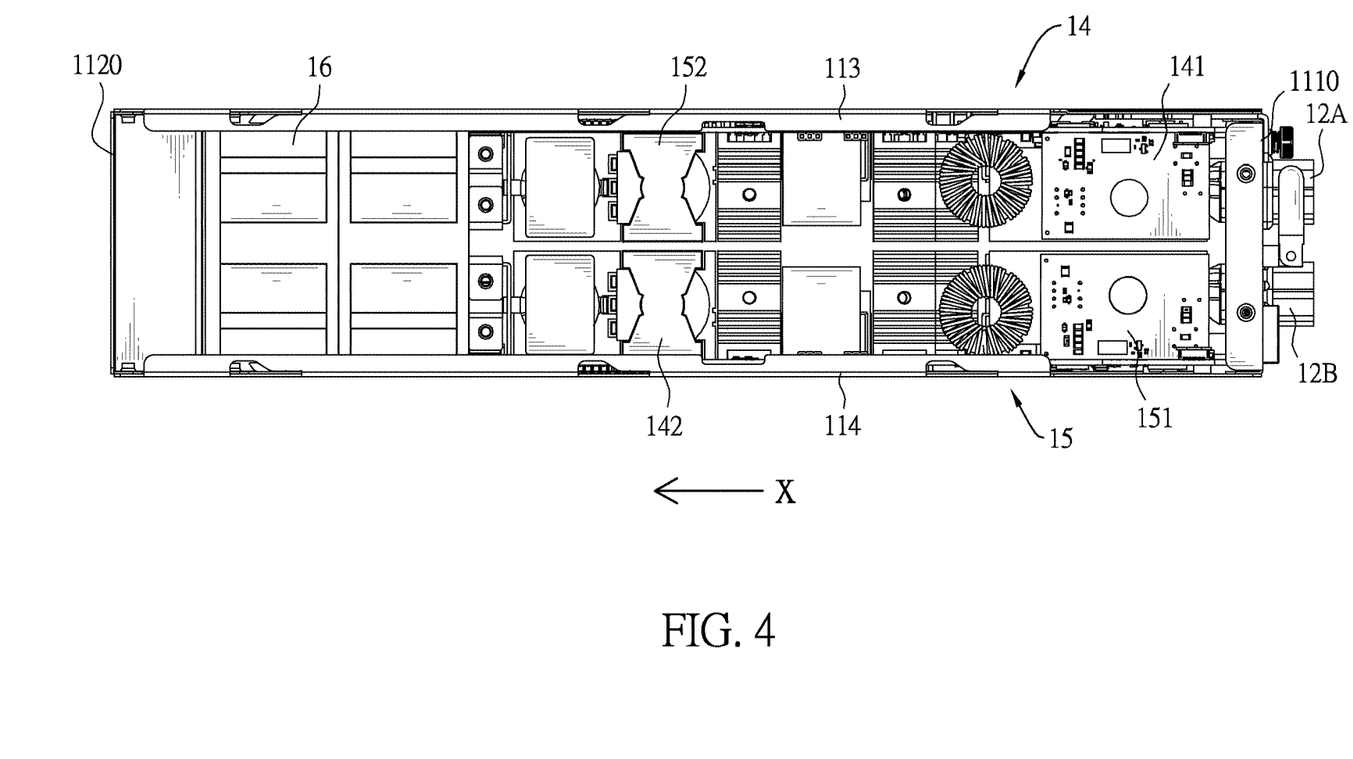
FIG. 4 is a top view of a preferred embodiment of the present invention.
Figure 5:
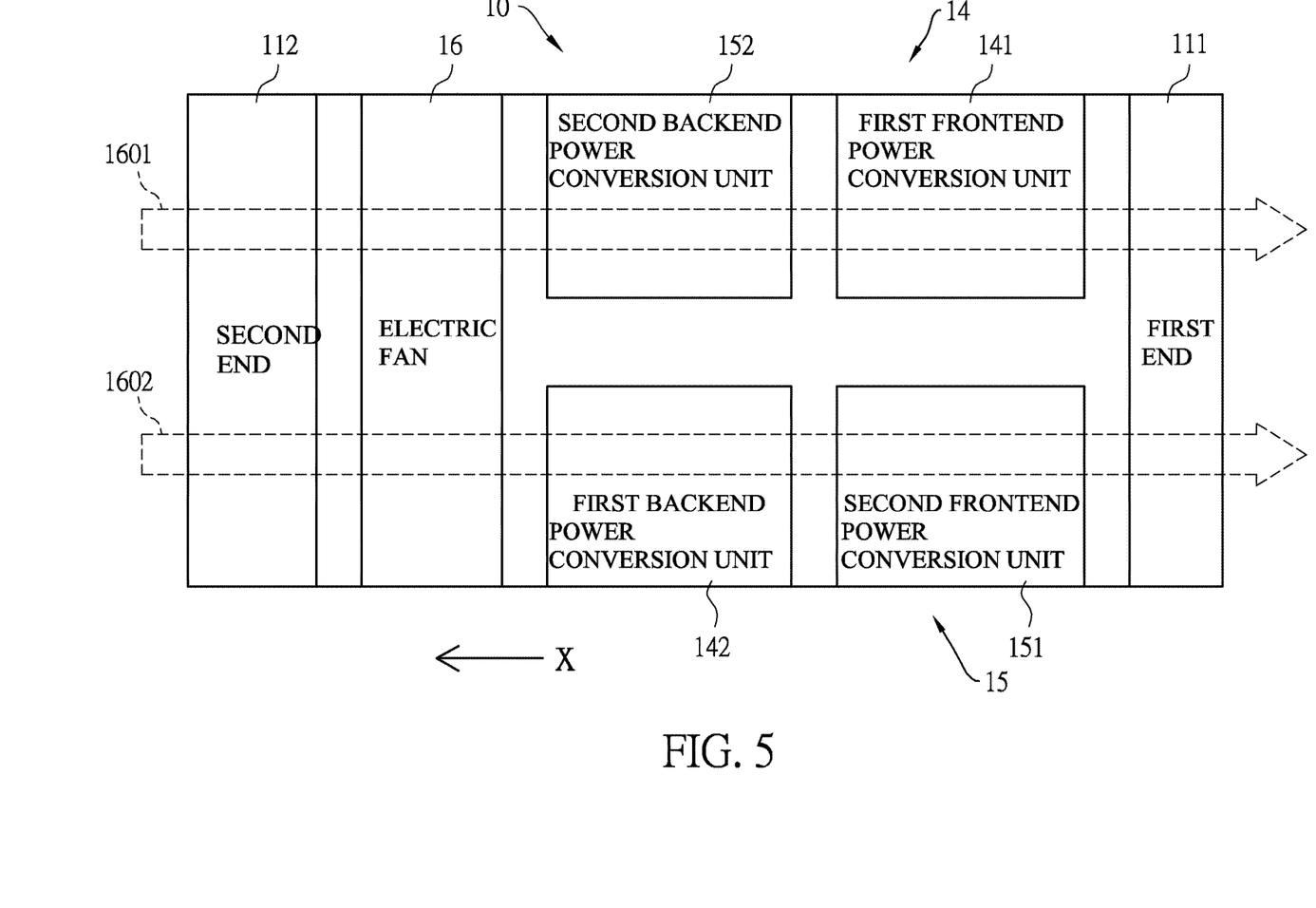
FIG. 5 is a top view of a preferred embodiment of the present invention.

With reference to FIG. 4 and FIG. 5, a first air flow passage 1601 and a second air flow passage 1602 are formed separately in the accommodation space 110 between the second end 112 and the first end 111 of the housing 11. The first power supply module 14 is disposed inside of the accommodation space 110 and between the second end 112 and the first end 111 of the housing 11. The first power supply module 14 includes a first frontend power conversion unit 141 and a first backend power conversion unit 142.

The second power supply module 15 is disposed inside of the accommodation space 110 and is staggered with the first power supply module 14. The second power supply module 15 is also between the second end 112 and the first end 111 of the housing 11. The second power supply module 15 includes a second frontend power conversion unit 151 and a second backend power conversion unit 152. The inputs of the first and the second frontend power conversion units 141, 151 are connected to the first and the second power input ports 12A and 12B, respectively.

The first frontend power conversion unit 141 and the second frontend power conversion unit 151 are next to the inner side of the first sidewall 113, and the second frontend power conversion unit 151 and the first backend power conversion unit 142 are next to the inner side of the second sidewall 114.

Moreover, the first frontend power conversion unit 141 and the second backend power conversion unit 152 are at the first air passage 1601, whereas the second frontend power conversion unit 151 and the first backend power conversion unit 142 are at the second air passage 1602.

The electric fan 16 is disposed inside of the accommodation space 110 of the housing 11, and in this embodiment, the electric fan 16 is at the second end 112.

The first power supply module 14, the second power supply module 15 and the electric fan 16 are disposed in tandem along the first direction X. When the power supply with the staggered configuration is in operation, the electric fan 16 turns and drives the air to flow, such that air enters and exits the accommodation space 110 from the first end 111 and the second end 112 of the housing 11. At the same time, the air inside the housing 11 will flow along the first airflow passage 1601 and the second airflow passage 1602 along the first direction X. When the first power supply module 14 is in operation and the second power supply module 15 is idle, the first frontend power conversion unit 141 and the first backend power conversion unit 142 are at separate air passages 1601, 1602 and the heat will be dissipated through the separate airflows along the air passages 1601, 1602, respectively. Although the second frontend power conversion unit 151 and the second backend power conversion unit 152 are also at the air passages 1602, 1601 respectively, yet the power supply module 15 is idling, therefore, the power conversion units 151, 152 won't cause the air temperature to rise, so that the separate airflows can be solely dedicated to effectively cool down the first frontend power conversion unit 141 and the first backend power conversion unit 142.

In a preferred embodiment, the first frontend power conversion unit 141 and the second frontend power conversion unit 151 each include either a rectifying unit or a power factor adjusting unit or both.

The first backend power conversion unit 142 and the second backend power conversion unit 152 are DC/DC converters.

With reference to FIG. 1, FIG. 2 and FIG. 4, the power supply with the staggered configuration of the present invention further includes a first circuit board 140 and a second circuit board 150. The first circuit board 140 is disposed next to the first side wall 113 of the housing 11, and the first frontend power conversion unit 141 and the second backend power conversion unit 152 are mounted on the first circuit board 140. The second circuit board 150 is disposed next to the second side wall 114 of the housing 11, and the second frontend power conversion unit 151 and the first backend power conversion unit 142 are mounted on the second circuit board 150.

Moreover, with reference to FIG. 2 and FIG. 3, the power supply with the staggered configuration of the present invention further includes a third circuit board 17. The third circuit board 17 is disposed inside of the accommodation space 110 of the housing 11, and is electrically connected to the first circuit board 140 and the second circuit board 150.

The power output port 13 is mounted on the third circuit board 17 and has a terminal extending beyond the second end 112 of the housing 11. The first frontend power conversion unit 141 is connected to the first backend power conversion unit 142 through the third circuit board 17.

Through the third circuit board 17, it is easy and fast to electrically connect the staggered frontend and backend power conversion units 141 and 142 of the first power supply module 14 as well as the staggered frontend and backend power conversion units 151 and 152 of the second power supply module 15.

Figure 6:
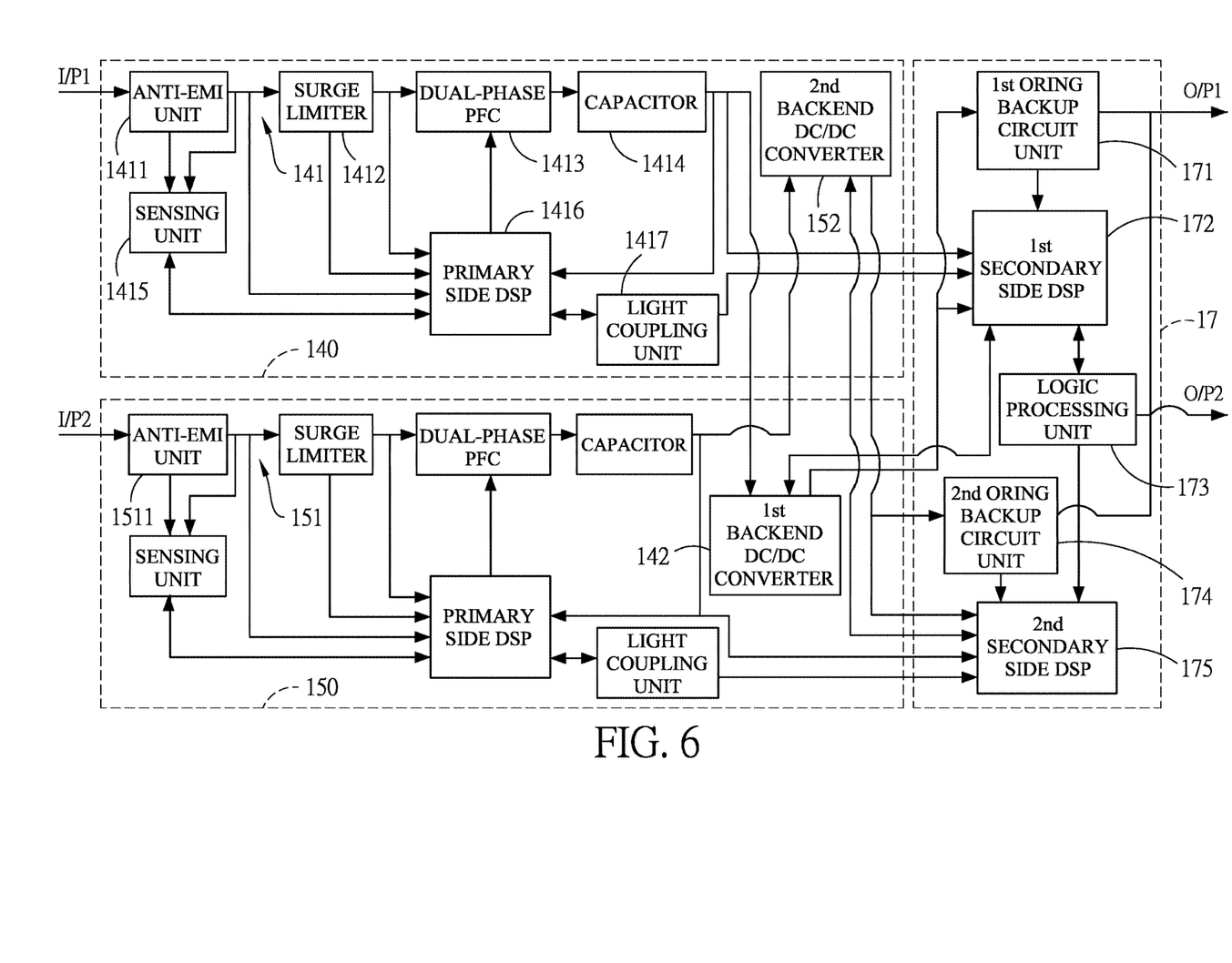
FIG. 6 is a block diagram of a preferred embodiment of the present invention.

With reference to FIG. 6, the first circuit board 140 is mounted with the first frontend power conversion unit 141 and the second backend power conversion unit 152. The second circuit board 150 is mounted with the second frontend power conversion unit 151 and the first backend power conversion unit 142. In this preferred embodiment of the present invention, the first backend power conversion unit 142 is a DC/DC converter and similarly the second backend power conversion unit 152 is also a DC/DC converter.

Furthermore, the first frontend power conversion unit 141 and the second frontend power conversion unit 151 are the same in this embodiment. Take the first frontend power conversion unit 141 as an example. The first frontend power conversion unit 141 comprises serially electrically connected parts including: an anti-electromagnetic interference unit 1411, a surge wave limiter 1412, a dual-phase power factor controller 1413, a large capacitor unit 1414, and an input sensing unit 1415 which is electrically connected to the anti-electromagnetic interference unit 1411. The first frontend power conversion unit 141 further comprises a primary side digital signal processing unit 1416 which is electrically connected to the anti-electromagnetic interference unit 1411, the surge wave limiter 1412, the dual-phase power factor controller 1413, the large capacitor unit 1414, and the input sensing unit 1415. The first frontend power conversion unit 141 further comprises a light coupling unit 1417 which is electrically connected to the primary side digital signal processing unit 1416. The anti-electromagnetic interference units 1411, 1511 of the first and the second frontend power conversion units 141, 151 can be connected to a common power input port 12 (not shown in FIG. 6) in one configuration and can each be separately connected to a power input port 12A and a power input port 12B through inputs I/P1 and I/P2 in another configuration.

The third circuit board 17 is mounted with a first O-ring backup circuit unit 171, a first secondary side digital signal processing unit 172, a logic processing unit 173, a second O-ring backup circuit unit 174 and a second secondary side digital signal processing unit 175.

The first O-ring backup circuit unit 171 is electrically connected to the first backend power conversion unit 142 (in this case, a DC/DC converter) and the first secondary side digital signal processing unit 172. The first secondary side digital signal processing unit 172 is electrically connected to the large capacitor unit 1414, the light coupling unit 1417, the first backend power conversion unit 142 (in this case, a DC/DC converter), and the logic processing unit 173.

The second O-ring backup circuit unit 174 is electrically connected to the second backend power conversion unit 152 (in this case, a DC/DC converter) and the second secondary side digital signal processing unit 175. The second secondary side digital signal processing unit 175 is electrically connected to the large capacitor unit 1414, the light coupling unit of the second frontend power conversion unit 151, the second backend power conversion unit 152 (in this case, a DC/DC converter), and the logic processing unit 173. The first O-ring backup circuit unit 171 and the second O-ring backup circuit unit 174 are commonly connected to a first output end O/P1, namely, the power output port 13. The logic processing unit 173 is connected to a signal output end O/P2 to be further connected to a system interface.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A power supply with a staggered configuration comprising:
   a housing including a first sidewall and a second sidewall which are in parallel with a first direction, wherein an accommodation space is formed between the first sidewall and the second sidewall, wherein opposite ends of the housing along the first direction are a first end and a second end, respectively;
   a first power supply module disposed inside of the accommodation space of the housing and between the first end and the second end of the housing;
   a second power supply module disposed inside of the accommodation space of the housing and staggered with the first power supply module as well as between the first end and the second end of the housing; wherein the first power supply module includes a first frontend power conversion unit and a first backend power conversion unit; the second power supply module includes a second frontend power conversion unit and a second backend power conversion unit; wherein the first frontend power conversion unit and the second backend power conversion unit are next to an inner side of the first sidewall, and the second frontend power conversion unit and the first backend power conversion unit are next to an inner side of the second sidewall;
   a first power input port disposed at the first end of the housing and connected to an input of the first frontend power conversion unit;
   a second power input port disposed at the first end of the housing and connected to an input of the second frontend power conversion unit;
   a power output port disposed at the second end of the housing;
   a first circuit board disposed inside of the accommodation space and on the first sidewall of the housing, wherein the first frontend power conversion unit and the second backend power conversion unit are mounted on the first circuit board;
   a second circuit board disposed inside of the accommodation space and on the second sidewall of the housing, wherein the second frontend power conversion unit and the first backend power conversion unit are mounted on the second circuit board; and
   a third circuit board disposed inside of the accommodation space of the housing and connected to the first circuit board and the second circuit board, wherein the power output port is mounted on the third circuit board and extends beyond the second end of the housing, the first frontend power conversion unit is connected to the first backend power conversion unit through the third circuit board, and the second frontend power conversion unit is connected to the second backend power conversion unit through the third circuit board.

2. The power supply as claimed in claim 1, wherein
   a first O-ring backup circuit unit, a first secondary side digital signal processing unit, a logic processing unit, a second O-ring backup circuit unit and a second secondary side digital signal processing unit are mounted on the third circuit board; wherein the first O-ring backup circuit unit and the second O-ring backup circuit unit are both connected to the power output port.

3. The power supply as claimed in claim 1, wherein
   the first power input port and the second power input port are each a direct current input port or an alternating current input port.

4. The power supply as claimed in claim 1, further comprising:
an electric fan disposed inside of the accommodation space; wherein
the electric fan is mounted on the second end of the housing.

5. The power supply as claimed in claim 1, wherein
the first frontend power conversion unit and the second frontend power conversion unit each include a rectifying unit or a power factor correction unit or both.

6. The power supply as claimed in claim 4, wherein
the first frontend power conversion unit and the second frontend power conversion unit each include a rectifying unit or a power factor correction unit or both.

7. The power supply as claimed in claim 1, wherein the first backend power conversion unit and the second backend power conversion unit are DC/DC converters.

8. The power supply as claimed in claim 4, wherein the first backend power conversion unit and the second backend power conversion unit are DC/DC converters.

9. The power supply as claimed in claim 1, wherein multiple vents are formed on the first end and the second end of the housing.

10. The power supply as claimed in claim 4, wherein multiple vents are formed on the first end and the second end of the housing.

* * * * *